United States Patent
Terui

(10) Patent No.: US 6,225,694 B1
(45) Date of Patent: *May 1, 2001

(54) SEMICONDUCTOR DEVICE

(75) Inventor: Makoto Terui, Tokyo (JP)

(73) Assignee: Oki Electric Industry Co, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,751

(22) Filed: Aug. 28, 1998

(30) Foreign Application Priority Data

Sep. 2, 1997 (JP) .................................................. 9-236854
Jun. 17, 1998 (JP) ................................................. 10-170071

(51) Int. Cl.[7] ......................... H01L 23/48; H01L 23/12; H01L 23/04
(52) U.S. Cl. ......................... 257/704; 257/693; 257/698
(58) Field of Search ............................ 257/704, 693, 257/698, 697, 783, 778, 678; 174/50.51

(56) References Cited

U.S. PATENT DOCUMENTS

| | | | |
|---|---|---|---|
| 4,410,905 | * 10/1983 | Grabbe | 257/691 |
| 5,067,007 | * 11/1991 | Kanji et al. | 257/693 |
| 5,490,324 | * 2/1996 | Newman | 257/700 |
| 5,640,048 | * 6/1997 | Selna | 257/738 |
| 5,706,579 | * 1/1998 | Ross | 257/704 |
| 5,717,245 | * 2/1998 | Pedder | 257/691 |
| 5,763,939 | * 6/1998 | Yamashita | 257/668 |
| 5,789,810 | * 8/1998 | Gross et al. | 257/704 |
| 5,898,219 | * 4/1999 | Barrow | 257/713 |

FOREIGN PATENT DOCUMENTS 63-175450 * 7/1988 (JP) ..................................... 257/693

* cited by examiner

Primary Examiner—Sheila V. Clark
Assistant Examiner—Jhihan B Clark
(74) Attorney, Agent, or Firm—Jones Volentine, LLC

(57) ABSTRACT

A semiconductor device according to the invention of the present application comprises a substrate having a surface on which interconnections are formed, a semiconductor element connected to the interconnections and mounted on the substrate, and a conductive map for covering the semiconductor element electrically connected to a ground potential. Owing to the provision of the conductive cap for covering the semiconductor element in this way, the semiconductor device can prevent the emission of an electromagnetic wave to the outside and can be prevented from malfunctioning due to an external electromagnetic wave.

20 Claims, 7 Drawing Sheets

SEMICONDUCTOR DEVICE

BACKGROUND OF THE INVENTION

1. Field of the Invention

This invention relates to a semiconductor device, and particularly to a structure of a small-sized area array package.

2. Description of the Related Art

A conventional general small-sized area array package has a structure wherein a semiconductor chip is mounted on a substrate composed of an organic material or a substrate composed of a ceramic material, having wires or interconnections formed by a metal material such as copper foil or tungsten or the like with bumps 2 such as solder, gold or the like interposed therebetween, and external terminals such as solder balls or the like are provided at the lower surface of the substrate in lattice form after a liquid epoxy resin has been charged into an interval or space between the semiconductor chip and the substrate.

SUMMARY OF THE INVENTION

With the foregoing in view, it is therefore an object of the present invention to provide a semiconductor device capable of preventing the radiation of an electromagnetic wave to the outside and a malfunction developed due to an electromagnetic wave sent from the outside.

According to one aspect of this invention, for achieving the above object, there is provided a semiconductor device comprising a substrate having a surface with interconnections formed thereon, a semiconductor element electrically connected to the interconnections and mounted on the substrate, and a conductive cap for covering the semiconductor element electrically connected to a ground potential.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to FIGS. 1 and 2.

Figure 1:
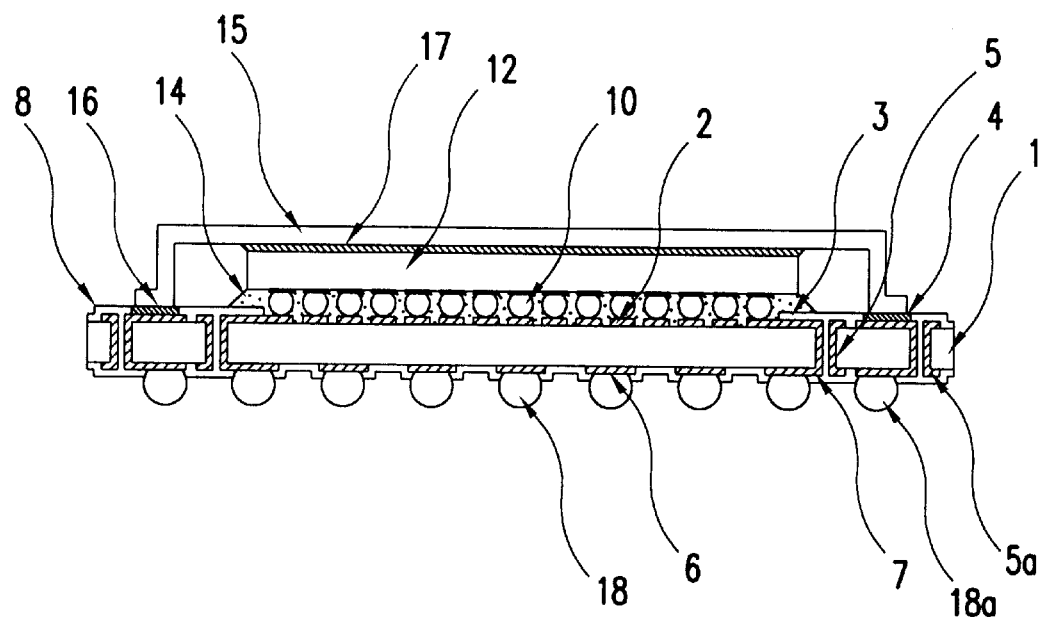
FIG. 1 is a cross-sectional view of a semiconductor device showing a first embodiment of the present invention.
Figure 2A:
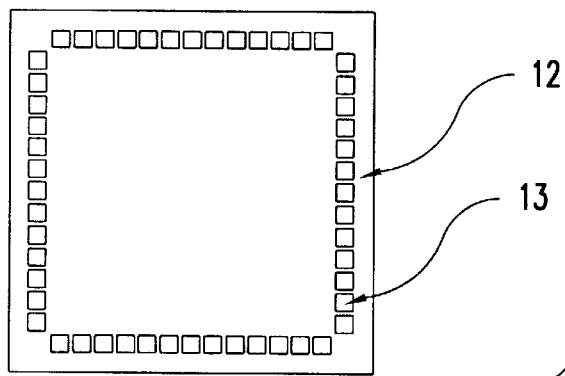
FIG. 2 is a plan view of the semiconductor device shown in FIG. 1.
Figure 2B:
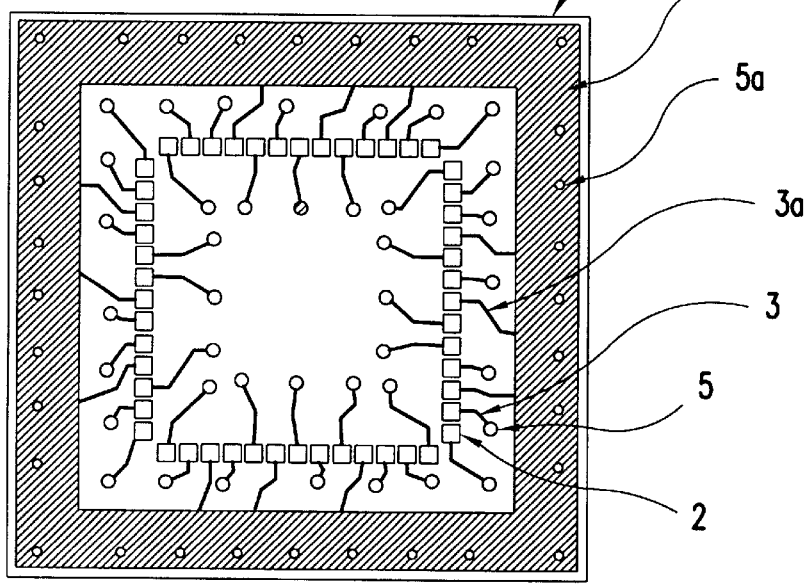
Figure 2C:
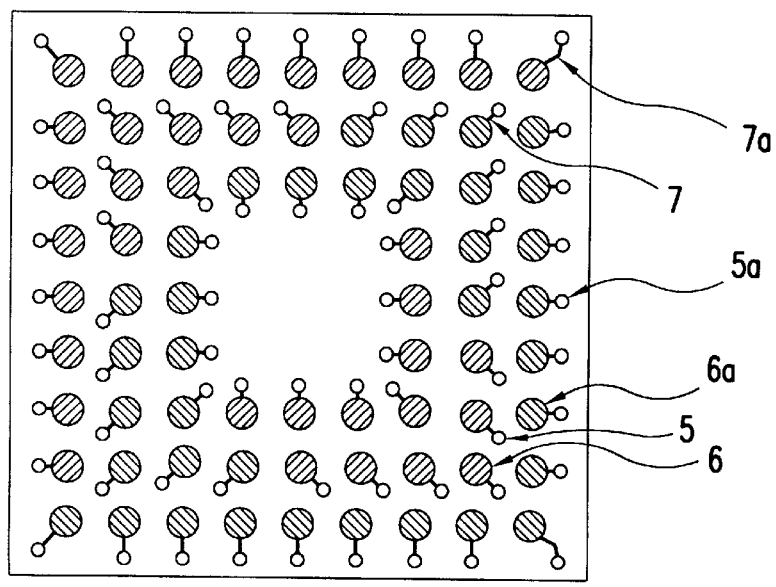

FIG. 1 is a cross-sectional view of a small-sized area array package showing a first embodiment of the present invention. FIG. 2(a) is a plan view of a semiconductor element as seen from the surface thereof on which electrode pads are formed, FIG. 2(b) is a plan view of a semiconductor element-equipped surface of a board or substrate, and FIG. 2(c) is a plan view of an external electrode forming surface of the substrate. FIG. 3 is an enlarged view of a seal ring.

Referring to FIGS. 1 and 2, wires or interconnections 3 are formed over the surface of the substrate 1 made from an organic material by copper foil. An organic material, ceramic or the like is normally used as the material for the substrate. However, when the substrate is composed of the organic material, the copper foil is placed over the entire surface of the substrate 1 and thereafter subjected to etching, thereby forming interconnections 3 including pads 2 for connecting to the semiconductor element.

Figure 3A:
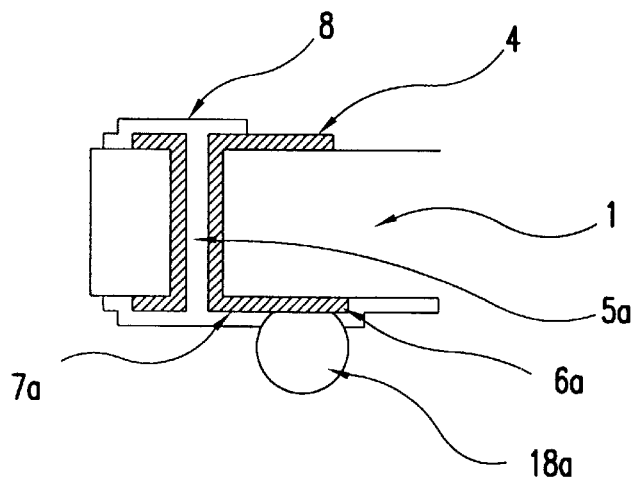
FIG. 3 is a partly enlarged view of the semiconductor device shown in FIG. 1.
Figure 3B:
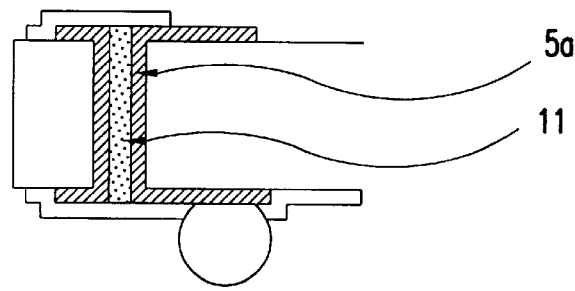

Upon etching at the formation of the interconnections 3, the copper foil is left even on the outer periphery of the substrate 1 as a seal ring 4 as shown in FIG. 3(a). The seal ring 4 is electrically connected to pads 6a for forming external terminals electrically connected to ground via through holes 5a defined in the substrate 1 and wires or interconnections 7a formed on the back of the substrate 1. An epoxy resin filling material 11 may be charged into each through hole 5a as shown in FIG. 3(b). Further, the seal ring 4 is electrically connected to its corresponding pads on the substrate, corresponding to electrodes connected to the ground of the semiconductor element through wires or interconnections 3a on the surface of the substrate.

The interconnections 3 formed on the substrate are electrically connected to their corresponding pads 6 for forming external terminals, via through holes 5 and wires or interconnections 7 formed on the back of the substrate.

The frontal surface or front and back of the substrate 1 including the interconnections 3 and 7 are covered with a solder resist 8 in a state in which the pads 2 and 6 and the seal ring 4 are respectively bare.

A semiconductor element 12 is mounted over the surface of the substrate 1 with bump electrodes 10 interposed therebetween. Unillustrated circuit elements and electrode pads 13 respectively connected to the circuit elements are formed over the surface of the semiconductor element 12. The electrode pads 13 and the pads 2 provided on the surface of the substrate 1 are electrically connected to one another through the bump electrodes 10. Further, an epoxy resin 14 is charged between the surface of the semiconductor element 12 on which the bump electrodes 10 are formed and the substrate 1.

A metal-made cap 15 for covering the semiconductor element 12 is provided on the substrate 1. The cap 15 is electrically connected to the substrate 1 through the seal ring 4 and a conductive material 16 such as solder, an anisotropic conductive adhesive or the like both formed on the substrate 1. This connection may be performed by seam welding.

Upon formation of the cap 15, the cap 15 and the semiconductor element 12 are connected to each other by an insulating adhesive 17.

External terminals 18 such as solder balls or the like are formed on the pads 6 for forming the external terminals, which are formed over the back of the substrate. Here, the outermost-peripheral external terminals 18a are electrically connected to the seal ring 4 provided on the surface of the substrate 1 through the through holes 5a. When they are contained on the motherboard, they are electrically connected to wires or interconnections for supplying ground on the motherboard side.

According to the first embodiment as described above, the outermost-peripheral external terminals electrically connected to the metal-made cap are respectively electrically connected to the interconnections for respectively supplying ground on the motherboard side. As a result, the metal-made cap, which covers the semiconductor element and the upper surface of the substrate, is brought to a ground potential. Thus, the package will result in a structure in which it is electrically shielded from the outside. Therefore, since an electromagnetic wave produced from the inside upon activation of the device and an externally-incoming electromagnetic wave are shielded by the metal-made cap, the malfunction of a device due to the emission and entry of the electromagnetic waves can be reduced.

Further, the use of a high-heat conductive material as the insulative adhesive for connecting the semiconductor element to the metal-made cap can provide expectations for an improvement in dissipation of heat from a semiconductor chip (a reduction in thermal resistance as a package).

Figure 3C:
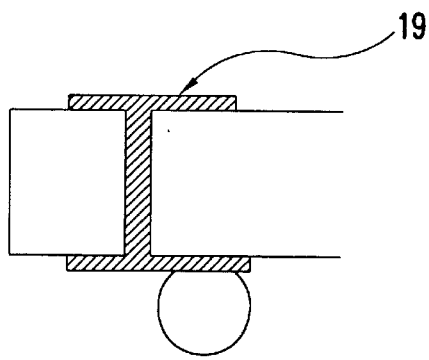

Further, a ceramic material may be used in place of the organic material as the material for the substrate. As an alternative to the interconnections formed by etching the copper foil in this case, the wires or interconnections are formed by printing conductive paste 19 such as copper, tungsten or the like as shown in FIG. 3(c) and thereafter the conductive paste 19 may be charged even into each through hole 5a.

A second embodiment of the present invention will next be explained.

Figure 4:
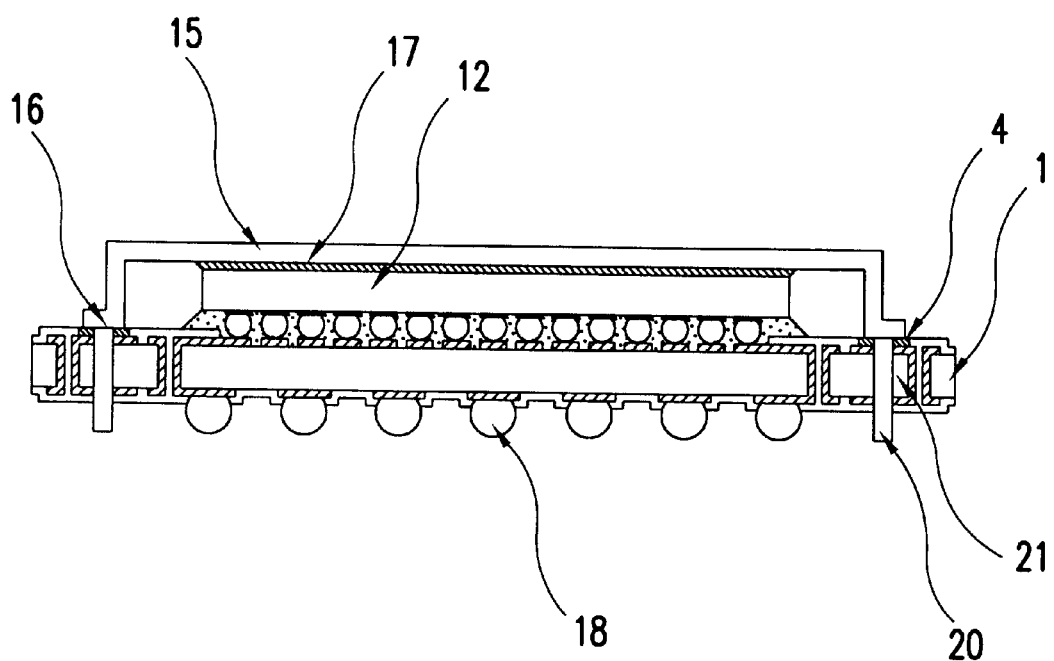
FIG. 4 is a cross-sectional view of a semiconductor device illustrating a second embodiment of the present invention.

FIG. 4 is a cross-sectional view of a small-sized area array package showing the second embodiment of the present invention. Incidentally, the same elements of structure as those illustrated in the first embodiment are identified by the same reference numerals in FIG. 4 and their description will be omitted.

In the second embodiment, support pins (protrusions) 20 are provided at the four corners of the surfaces of a metal-made cap 15, which mate with a substrate 1. Further, the support pins 20 penetrate into through holes 21 defined in the corners of an outer peripheral seal ring 4 on the surface of the substrate 1 so that they are exposed from the back (corresponding to an external-terminal mounting surface) of the substrate 1. Thereafter, the support pins 20 bared from the substrate 1 upon mounting the motherboard are electrically connected to wires or interconnections for supplying ground on the motherboard side.

Incidentally, the length of each support pin 20 is set in such a manner that the portion of each support pin 20, which is exposed from the back of the substrate 1, becomes lower than the height of each external terminal 18 (the length of the support pin varies according to the diameter of the external terminal 18 to be used and the type of flux or the like). Even in this case, the same method as that in the first embodiment is used for joining together the substrate 1 and the metal-made cap 15 and joining together a semiconductor element 12 and the metal-made cap 15.

Thus, the emission of an electromagnetic wave and the penetration of an electromagnetic wave from the outside can be reduced by covering the small-sized area array package with the metal-made cap 15 and electrically connecting it to the ground on the motherboard side through the support pins 20 attached to the metal-made cap 15.

By setting the length of each support pin 20 protruded through the back of the substrate 1 so as to be lower than the height of each external terminal 18, the amount of sinking of the package due to the melting of each external terminal 18 upon mounting of the motherboard can be adjusted.

When the support pins attached to the metal-made cap are connected to the ground on the motherboard side where the package is configured in this way, the metal-made cap covering the semiconductor element and the upper surface of the substrate is brought to a ground potential. As a result, the package will result in a structure in which it is apparently electrically shielded from the outside. Therefore, since an electromagnetic wave produced from the inside upon activation of the device and an externally-incoming electromagnetic wave are shielded by the metal-made cap, the malfunction of the device due to the emission and entry of the electromagnetic waves can be reduced.

Further, since the metal-made cap is joined to the semiconductor chip through the high-heat conductive insulating adhesive, an improvement in dissipation of heat from the semiconductor chip (a reduction in thermal resistance as a package) can be achieved.

Setting the length of each support pin protruded through the back of the substrate so as to be lower than the height of each external terminal 18 allows an adjustment to the amount of sinking of the package due to the melting of each external terminal at the mounting of the motherboard. Thus, the package can be prevented from excessively sinking upon mounting of the motherboard, and flux cleanability after the mounting of the motherboard and the reliability of connection with the motherboard can be improved.

A third embodiment of the present invention will next be described with reference to FIG. 5 and FIGS. 6(a) through 6(c). Incidentally, the same elements of structure as those illustrated in the first embodiment are identified by the same reference numerals and their description will be omitted.

Figure 5:
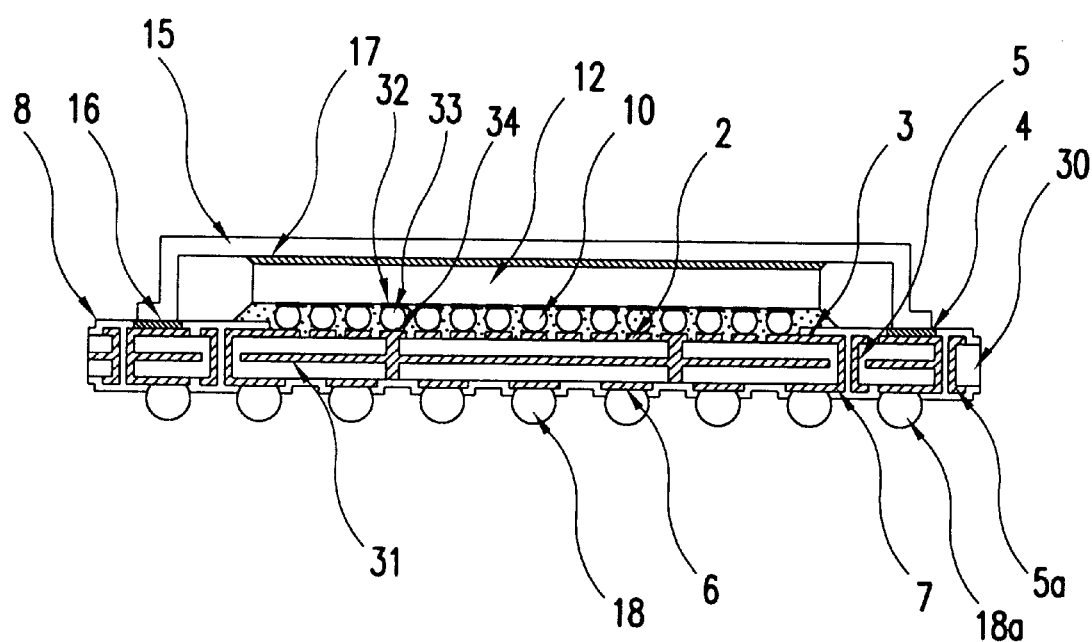
FIG. 5 is a cross-sectional view of a semiconductor device depicting a third embodiment of the present invention.

FIG. 5 is a cross-sectional view of the third embodiment. The third embodiment is different from the first embodiment in that it is formed by a multilayer board 30 provided therewithin with an intermediate layer 31 formed by a conductive layer.

Figure 6A:
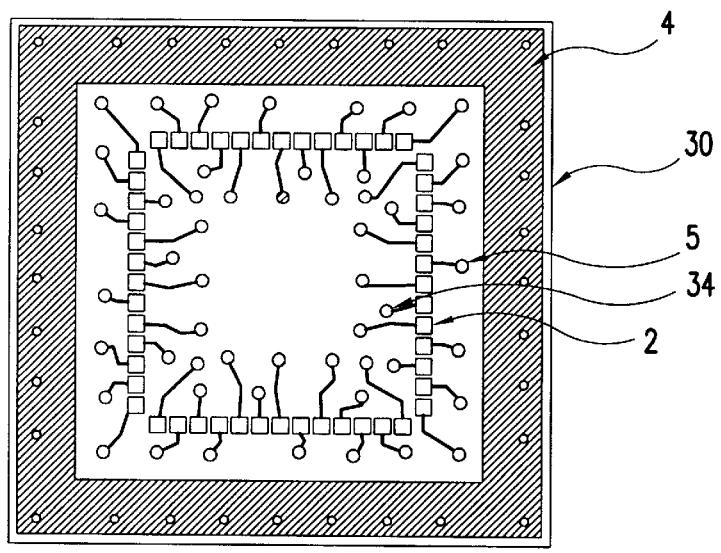
FIG. 6 is a plan view of the semiconductor device shown in FIG. 5.
Figure 6B:
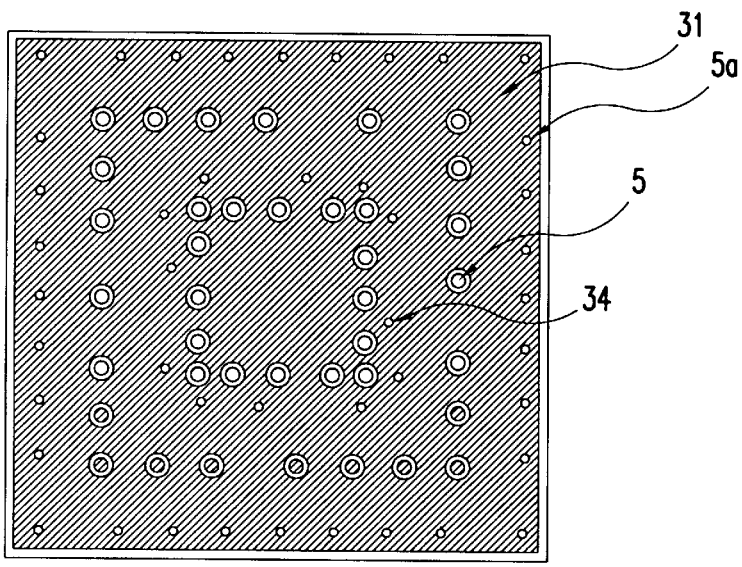
Figure 6C:
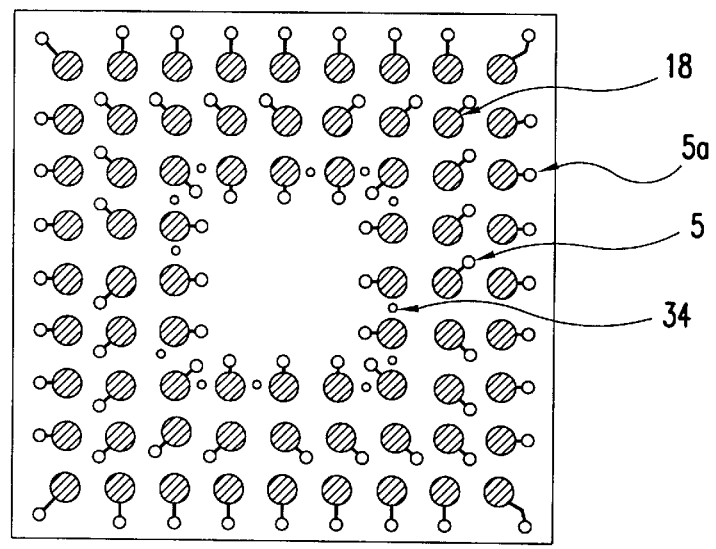

FIG. 6(a) is a plan view of the multilayer board 30 as viewed from the mounting side of a semiconductor element 12, FIG. 6(b) is a plan view showing the intermediate layer 31, and FIG. 6(c) is a plan view of the multilayer board 30 as seen from an external electrode forming surface, respectively.

The intermediate layer 31 composed of a metal material such as copper foil or tungsten or the like is provided in the multilayer board 30. The intermediate layer 31 is electrically connected to ground pads 32 of the semiconductor element 12 via through holes 34 and bump electrodes 33.

Further, the intermediate layer 31 is electrically connected via through holes 5a to a seal ring 4 formed on the board and external terminals 18a connected to ground.

External electrodes 18 supplied with signals such as an input and an output other than the ground are electrically connected to their corresponding electrodes of the semiconductor element via through holes 5. Spaces are provided around the through holes 5 disconnected to the ground so as to lie between the through holes 5 and the intermediate layer 31. They serve so as to prevent the through holes 5 and the intermediate layer 31 from contacting with each other.

Owing to the provision of the intermediate layer 31 as described above, the semiconductor element 12 is electrically cut off from the outside by a metal-made cap and the intermediate layer so that a higher shield effect can be expected.

Figure 7:
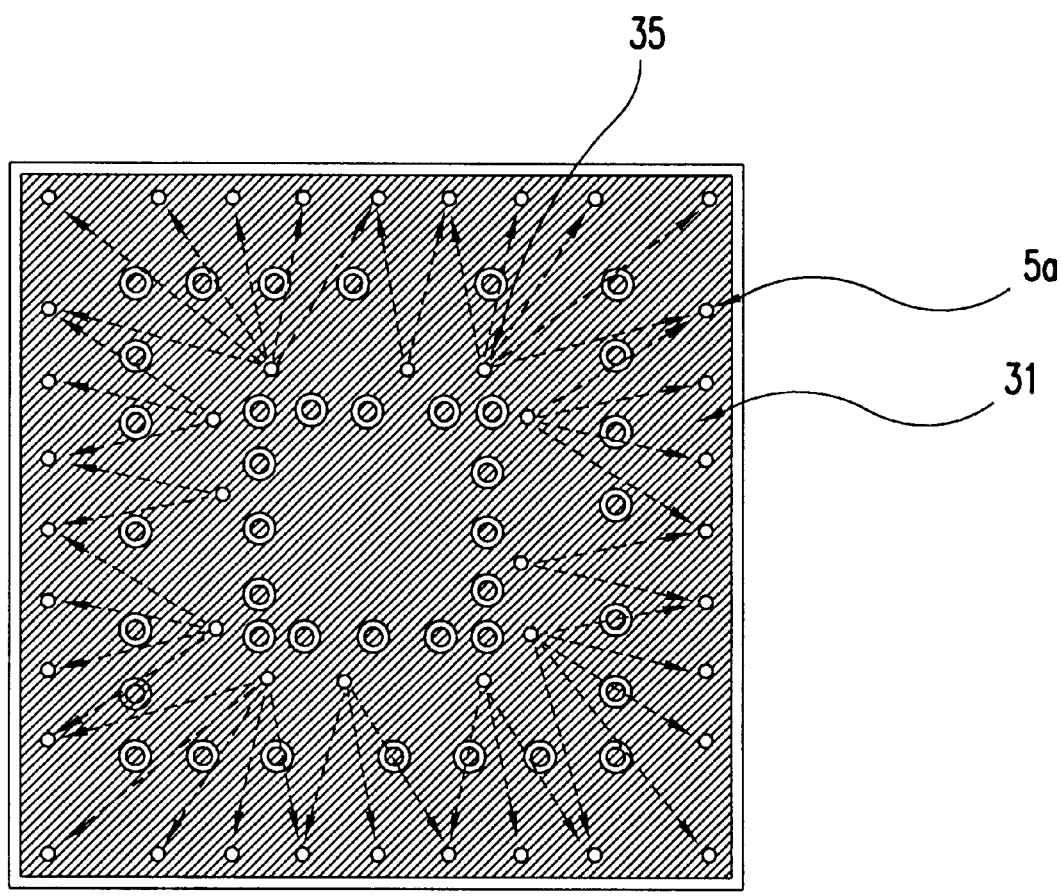
FIG. 7 is a plan view of the semiconductor device shown in FIG. 5.

When the external terminals 18a connected to the ground are placed so as to be rendered uniform as viewed from the center of the multilayer board 30, the distribution of a current over the intermediate layer 31 provided within the multilayer board 30 becomes uniform as indicated by arrows in FIG. 7. Thus, an effect can be expected that the impedance of the ground within the package including the cap 15 connected to the ground external terminals 18a is stabilized.

Further, when the external terminals placed on the outermost periphery of the multilayer board 30 are all set as the external terminals 18a electrically connected to the ground, the distribution of a current over the intermediate layer 31 becomes more uniform and the outermost periphery of each external terminal 18 is placed in a state surrounded by the ground. Therefore, a shield effect including the external terminals can be expected.

In a manner similar to the case described in the second embodiment even in the case of the third embodiment, the cap may be provided with the support pins so as to extend through the through holes defined in the corners of the board. In this case, the amount of sinking of the package due to the melting of each external terminal at the mounting of the motherboard can be adjusted so that the package can be prevented from excessively sinking upon mounting of the motherboard. Further, flux cleanability after the mounting of the motherboard and the reliability of connection with the motherboard can be improved.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
    a substrate having a main surface and a back surface, said substrate including interconnections formed on the main surface thereof;
    a semiconductor element mounted on said main surface of said substrate and electrically connected to the interconnections;
    a conductive cap for covering said semiconductor element, electrically connected to a ground potential; and
    at least one protrusion attached to said conductive cap and protruding through the back surface of said substrate, said protrusion being electrically connected to the ground potential.

2. The semiconductor device according to claim 1, further comprising a plurality of external electrodes formed on the back surface of said substrate, the external electrodes being connected to the interconnections via through holes extending through the main and back surfaces of said substrate.

3. The semiconductor device according to claim 1, wherein said substrate has a conductive intermediate layer connected to the ground potential, which is provided between the main and back surfaces of said substrate.

4. The semiconductor device according to claim 1, wherein said conductive cap is brought into contact with said semiconductor element through an insulating material.

5. The semiconductor device according to claim 1, wherein said conductive cap has a plurality of protrusions and wherein said protrusions are disposed substantially uniformly as viewed from the center of said substrate.

6. The semiconductor device according to claim 1, wherein said conductive cap has a plurality of protrusions and wherein said protrusions are provided around said substrate and said external electrodes are respectively formed inside the protrusions.

7. The semiconductor device according to claim 2, wherein said protrusion has a height which is less than the height of each of the external electrodes.

8. The semiconductor device according to claim 2, wherein a plurality of predetermined external electrodes are connected to the ground potential, and wherein the predetermined external electrodes are disposed substantially uniformly as viewed from the center of said substrate.

9. The semiconductor device according to claim 2, wherein the external electrodes are formed in the form of a plurality of rows and a predetermined external electrode located on the outermost periphery is connected to the ground potential.

10. A semiconductor device comprising:
    a substrate having a main surface and a back surface, said substrate including interconnections and a conductive layer surrounding the periphery thereof formed on the main surface thereof, the conductive layer being connected to a ground potential;
    a semiconductor element mounted on said substrate and electrically connected to said interconnections through electrodes formed on the main surface of said substrate;
    a conductive cap provided over the main surface of said substrate so as to cover said semiconductor element and being electrically connected to the conductive layer;
    at least one protrusion attached to said conductive cap and protruding through the back surface of said substrate, said protrusion being electrically connected to the conductive layer via a through hole formed in said substrate; and
    a plurality of external electrodes formed on the back surface of said substrate and electrically connected to said interconnections via second through holes.

11. The semiconductor device according to claim 11, wherein said substrate has a conductive intermediate layer lying between the main and back surfaces thereof.

12. The semiconductor device according to claim 10, wherein said semiconductor element is in contact with said conductive cap through an insulating material.

13. The semiconductor device according to claim 10, wherein said conductive cap has a plurality of protrusions and wherein said protrusions are disposed substantially uniformly as viewed from the center of said substrate.

14. The semiconductor device according to claim 10, wherein said conductive cap has a plurality of protrusions and wherein said protrusions are provided around said substrate and said external electrodes are respectively formed inside the protrusions.

15. A semiconductor device comprising:
    a substrate having a main surface and a back surface, said substrate including,
        interconnections formed on the main surface of said substrate,
        a conductive layer formed on a peripheral area of the main surface,
        a conductive intermediate layer formed between the main and back surfaces of said substrate,
        a plurality of first through holes extending through the main and back surfaces thereof so as to connect to the conductive intermediate layer, and
        a plurality of second through holes disconnected from the conductive intermediate layer;
    a semiconductor element having a plurality of electrodes respectively connected to said interconnections, including at least a plurality of signal electrodes for inputting or outputting signals and a plurality of ground electrodes connected to a ground potential;

a conductive cap connected to the conductive layer for covering said semiconductor element;

a plurality of protrusions attached to said conductive cap and protruding through the back surface of said substrate, said protrusions being electrically connected to the conductive intermediate layer through corresponding ones of the first through holes;

a plurality of first external electrodes respectively connected to the ground electrodes through corresponding ones of the first through holes; and a plurality of second external electrodes respectively connected to the signal electrodes through the second through holes.

16. The semiconductor device according to claim 15, wherein said first external electrodes are placed substantially uniformly as viewed from the center of said substrate.

17. The semiconductor device according to claim 15, wherein said first external electrodes are disposed near ends of said substrate so as to surround the second external electrodes.

18. A semiconductor device comprising:

a substrate having a main surface and a back surface, said substrate including interconnections formed on the main surface thereof;

a semiconductor element mounted on said main surface of said substrate and electrically connected to the interconnections;

a conductive cap for covering said semiconductor element, electrically connected to a ground potential; and at least one protrusion formed in said substrate, penetrating from the main surface to the back surface, one part of the protrusion being attached to said conductive cap, another part of the protrusion being protruded from the back surface of said substrate.

19. A semiconductor device comprising:

a substrate having a main surface and a back surface, said substrate including interconnections and a conductive layer surrounding the periphery thereof formed on the main surface thereof, the conductive layer being connected to a ground potential;

a semiconductor element mounted on said substrate and electrically connected to said interconnections through electrodes formed on the main surface of said substrate;

a conductive cap provided over the main surface of said substrate so as to cover said semiconductor element and being electrically connected to the coductive layer;

at least one protrusion formed in said substrate, penetrating from the main surface to the back surface, one part of the protrusion being attached to said conductive cap, another part of the protrusion being protruded from the back surface of said substrate, the protrusion being electrically connected to the conductive layer via a through hole formed in said substrate; and a plurality of external electrodes formed on the back surface of said substrate and electrically connected to said interconnections via second through holes.

20. A semiconductor device comprising:

a substrate having a main surface and a back surface, said substrate including, interconnections formed on the main surface of said substrate, a conductive layer formed on a peripheral area of the main surface, a conductive intermediate layer formed between the main and back surfaces of said substrate, a plurality of first through holes extending through the main and back surfaces thereof so as to connect to the conductive intermediate layer, and a plurality of second through holes disconnected from the conductive intermediate layer;

a semiconductor element having a plurality of electrodes respectively connected to said interconnections, including at least a plurality of signal electrodes for inputting or outputting signals and a plurality of ground electrodes connected to a ground potential;

a conductive cap connected to the conductive layer for covering said semiconductor element;

a plurality of protrusions formed in said substrate, penetrating from themain surface to the back surface, one part of each protrusion being attached to said conductive cap, and another part of each protrusion being protruded from the back surface of said substrate, said protrusions being electrically connected to the conductive intermediate layer through corresponding ones of the first through holes;

a plurality of first external electrodes respectively connected to the ground electrodes through corresponding ones of the first through holes; and a plurality of second external electrodes respectively connected to the signal electrodes through the second through holes.

* * * * *